United States Patent [19]
Werrbach

[11] Patent Number: 5,359,665
[45] Date of Patent: Oct. 25, 1994

[54] AUDIO BASS FREQUENCY ENHANCEMENT

[75] Inventor: Donn R. Werrbach, Burbank, Calif.

[73] Assignee: Aphex Systems, Ltd., Sun Valley, Calif.

[21] Appl. No.: 157,430

[22] Filed: Nov. 26, 1993

Related U.S. Application Data

[63] Continuation of Ser. No. 923,373, Jul. 31, 1992, abandoned.

[51] Int. Cl.$^5$ .............................................. H03G 9/00
[52] U.S. Cl. .................................... 381/102; 381/106
[58] Field of Search ................ 381/55, 68.2, 98, 101, 381/102, 103, 120, 106; 333/14

[56] References Cited

U.S. PATENT DOCUMENTS

| | | |
|---|---|---|
| 2,379,714 | 7/1945 | Hollingsworth . |
| 2,408,692 | 10/1946 | Shore . |
| 3,127,476 | 3/1964 | David, Jr. . |
| 3,281,533 | 10/1966 | Pflager et al. . |
| 3,539,725 | 11/1970 | Hellwarth et al. ................ 381/98 |
| 3,805,177 | 4/1974 | Risley ................ 381/107 |
| 3,842,702 | 10/1974 | Tsundoo . |
| 4,150,253 | 4/1979 | Knoppel . |
| 4,182,930 | 1/1980 | Blackmer . |
| 4,982,435 | 1/1991 | Kato et al. ................ 381/102 |
| 5,023,490 | 6/1991 | Gittinger ................ 307/492 |
| 5,175,770 | 12/1992 | Back ................ 381/98 |
| 5,276,764 | 1/1994 | Dent ................ 381/106 |

OTHER PUBLICATIONS

Don Lacaster, Active Filter Cookbook, 1979, pp. 46-57.

Primary Examiner—Forester W. Isen
Attorney, Agent, or Firm—Thomas I. Rozsa; Tony D. Chen

[57] ABSTRACT

A device for enhancing the bass frequency components in an audio signal while avoiding overload problems associated with fixed levels of bass frequency enhancement. The device divides the input signal into two parts, the first of which passes through to the output of the device. The second part of the input signal is input into a low pass filter which passes only the bass components of the input signal and imparts a frequency dependent phase shift to the bass components. The bass components then pass through a variable gain amplifier which may or may not invert the polarity of the bass components and then are recombined with the first part of the audio signal. The gain of the variable gain amplifier is varied in accord with the level of the bass components. As a consequence the device provides greater enhancement of the bass frequencies when they are at lower levels and less enhancement when the bass frequencies are at higher levels, thereby reducing the likelihood of overloading any subsequent audio signal amplifiers. The enhancement is the result of a dynamically changing frequency response and increased duration of the bass frequencies.

7 Claims, 2 Drawing Sheets

AUDIO BASS FREQUENCY ENHANCEMENT

This application is a continuation of application Ser. No. 07/923,373, filed Jul. 31, 1992, now abandoned.

BACKGROUND OF THE INVENTION a. Field of the Invention

This invention pertains to audio signal processing devices. More particularly this invention pertains to devices used to increase the amount of energy contained in the lower or bass frequencies of an audio signal relative to the higher frequency components without overloading any subsequent audio amplifiers.

b. Description of the Prior Art

Several methods have been used in the prior art to increase the energy contained in the lower or bass frequencies in an audio signal relative to the higher frequency components. For instance, a set of band-pass filters, each having an adjustable attenuation, has been used to emphasize or de-emphasize the frequency components within each band of frequencies relative to the components within the other bands. If the attenuation of the low frequency band-pass filter is adjusted to be less than the attenuation of the higher frequency band-pass filters, the low frequency components are enhanced relative to the higher frequency components. A single filter that exhibits a lower attenuation for low frequency components relative to its attenuation for higher frequency components may also be used for this purpose. However, because the peak level of the audio input signal is typically primarily determined by the peak level of the low frequency components, a simple "pre-emphasis" of the low frequency components often results in the overloading of any subsequent audio amplifiers.

Multiband compression has also been used to emphasize the bass components. A multiband compression system splits the audio signal into separate bands of frequency components and then separately compresses the amplitude range of the signals within each of these bands.

The energy in the bass components relative to the higher frequencies has also been increased by combining the input audio signal with subharmonics of the input audio signal. This method, however, very often substantially increases the peak level of the signal.

SUMMARY OF THE INVENTION

The present device divides the input signal into two parts, the first of which passes directly to the output of the device. The second part passes through a low pass filter which passes only the bass components of the input signal and imparts a frequency dependent phase shift to those bass components. The bass components then pass through a variable gain amplifier and then are recombined with the first part of the audio signal. The gain of the variable gain amplifier is varied in accord with the level of the bass components, As a consequence the device provides greater enhancement of the bass signals when the bass signals are at a lower level and less enhancement when the bass signals are at a higher level, thus reducing the likelihood of overloading any subsequent audio signal amplifiers. Due to the amplitude and time relationships between the audio signals in the two paths, the recombination of the two parts of the input signal produces a dynamically changing frequency response characteristic and a longer duration of bass frequencies.

DETAILED DESCRIPTION

Figure 1:
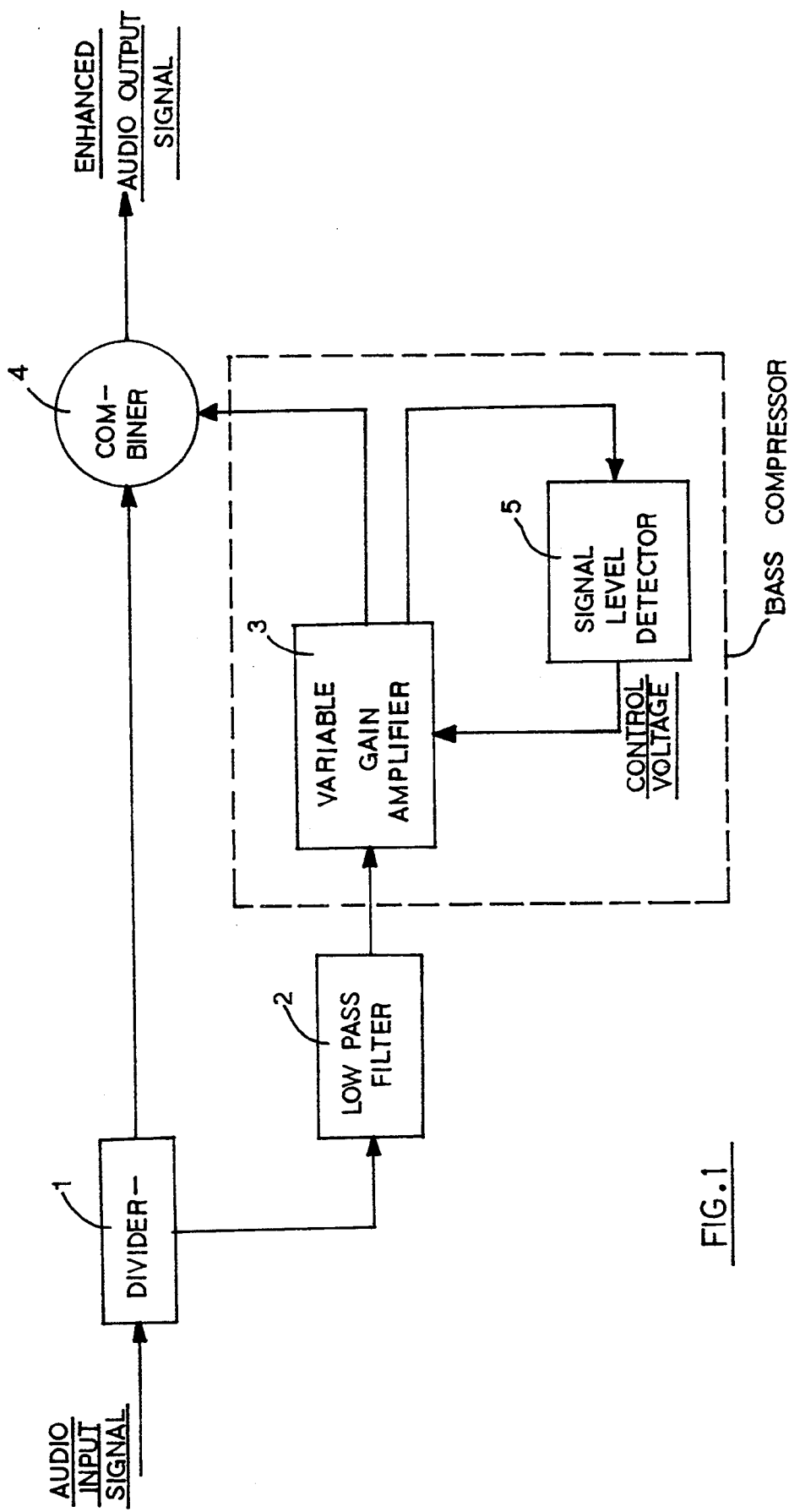
FIG. 1 is a block diagram of the invention.

Referring to FIG. 1, the audio signal is input to divider 1, which divides the audio signal into first and second parts. The first part of the input signal is input to combiner 4 where it is "mixed" or combined with the audio signal output from variable gain amplifier 3.

The second part of the input signal is input to lowpass filter 2 which passes only the low frequency components, i.e. the bass frequencies that are contained within the second part of the input signal. The bass frequencies output from lowpass filter 2 are input to variable gain amplifier 3, which amplifies the bass frequencies. Circuitry within signal level detector 5 senses the amplitude level of the signal output from lowpass filter 2 and outputs a control voltage to variable gain amplifier 3 of the bass signal that is output from variable gain amplifier 3 does not exceed a preselected level.

The signal output from variable gain amplifier 3 is then combined or mixed in combiner 4 with the first part of the input audio signal to produce the enhanced audio signal that is output from the device. By preselection, the polarity of signal output from variable gain amplifier 3 may or may not be inverted relative to the signal input to variable gain amplifier 3.

Figure 2:
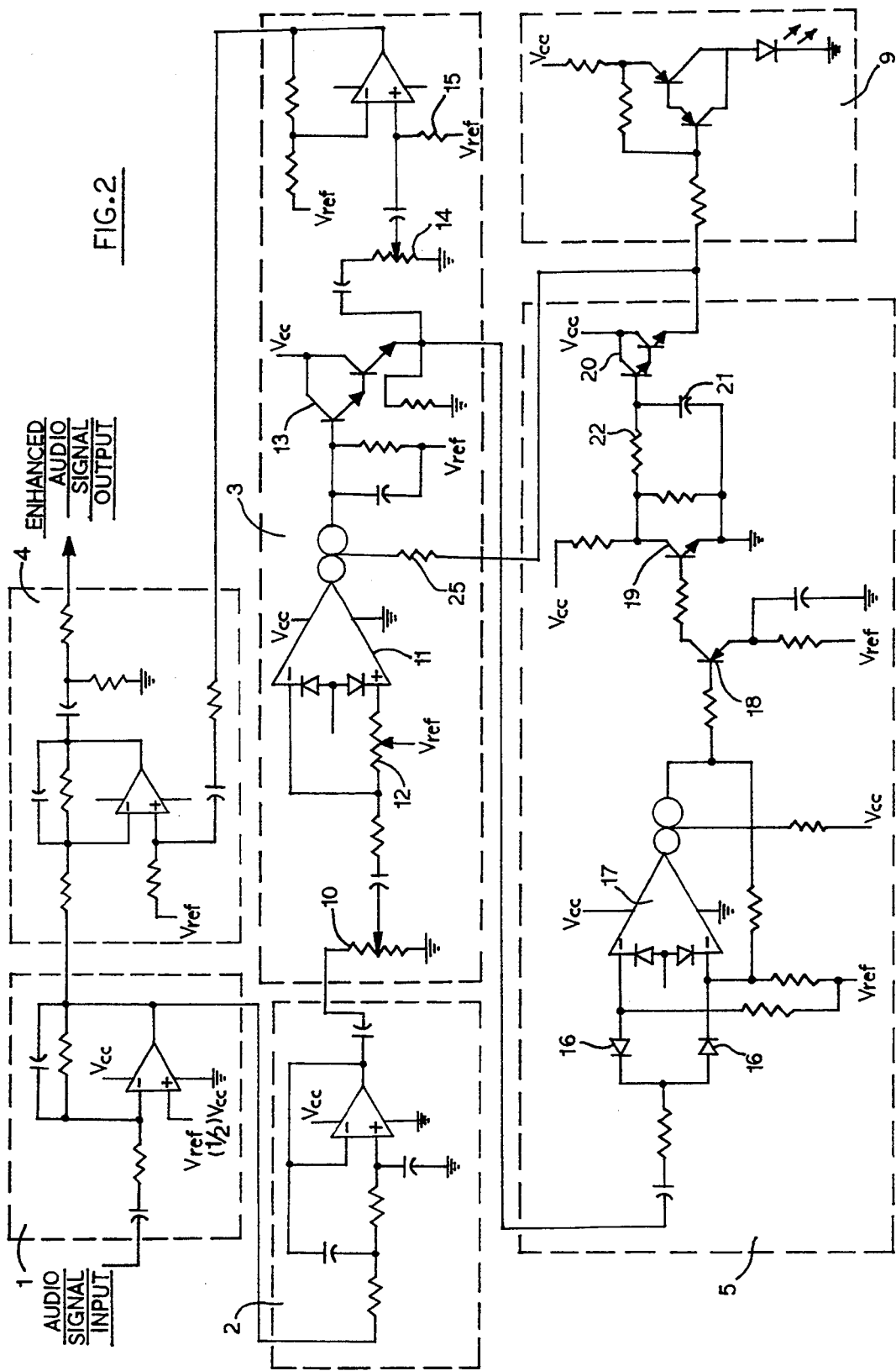
FIG. 2 is a schematic diagram of the invention.

Referring to FIG. 2, a second order Sallen-Key low pass filter having a cut-off frequency of 80 hertz operates as low pass filter 2.

Variable attenuator 10 in variable gain amplifier 3 adjusts the level of amplification of bass signals having a low signal level. Operational transconductance amplifier 11 functions as the variable gain amplifier. Potentiometer 12 is adjusted to minimize the shift in D.C. voltage at the output of amplifier 11 with varying control voltage signal levels.

Darlington transistor 13 buffers the output of amplifier 11 and potentiometer 14 is used to set the upper limit of the bass signal level that is output to combiner 4. Resistor 15 provides a d.c. voltage reference level for the device. In the preferred embodiment, the amplified bass signal that is input to combiner 4 is inverted relative to the bass signal that is input to variable gain amplifier 3. However, where desirable, an inverting amplifier may be substituted for one of the non-inverting amplifiers within variable gain amplifier 3 so as to supply a non-inverted bass signal to combiner 4.

Full wave rectifier 16 is used in combination with operational transconductance amplifier 17 followed by transistors 18 and 19 and Darlington transistor 20 to generate a voltage responsive to the level of the bass signal. The voltage output from Darlington transistor 20, in turn, operates through resistor 25 to control the current amplification provided by operational transconductance amplifier 11. A bass signal input to full wave rectifier 16 causes the voltage at the output of operational transconductance amplifier 17 to move in a negative direction, which causes transistor 18 to begin to conduct current which, in turn, causes transistor 19 to begin to conduct, causing capacitor 21 to begin to discharge through timing resistor 22. Darlington transistor 20 buffers the voltage across capacitor 21, which voltage is converter to a current through resistor 25, and used to control the amplification provided by operational transconductance amplifier 11.

The LED and the other components within dashed lines 9 respond to the variations in the voltage across capacitor 21 to provide a visual indication of the operation of variable gain amplifier 3.

I claim:

1. An audio signal processing device for enhancing bass frequency components of an input audio signal without substantially increasing the peak level of the input audio signal, comprising:
   a. means for splitting said input audio signal into a first part and a second part;
   b. a low pass filter for filtering said second part of said input audio signal and outputting bass frequency components of said second part of said input audio signal;
   c. a close-loop bass compressor coupled to said low pass filter and utilizing a closed loop control circuitry for processing said bass frequency components and producing dynamically compressed bass frequency components; and
   d. said first part of said input audio signal and said dynamically compressed bass frequency components being combined in an out-of-phase relationship for delivering an output signal wherein said bass frequency components are dynamically enhanced without substantially increasing the peak level of said input audio signal to prevent overloading any subsequent audio amplifiers.

2. The audio signal processing device as defined in claim 1 wherein said close-loop bass compressor further comprises:
   a. a variable gain amplifier coupled to said low pass filter for processing said bass frequency components output from said low pass filter and producing compressed bass frequency components; and
   b. a signal level detector coupled to said variable gain amplifier for detecting said bass frequency components and providing a responsive gain control signal to said variable gain amplifier, such that said variable gain amplifier provides greater gain of said bass frequency components when said bass frequency components are at a lower level but lesser gain of said bass frequency components when said bass frequency components are at a higher level.

3. The audio signal processing device as defined in claim 1 wherein said dynamically compressed bass frequency components produced by said close-loop bass compressor are not inverted relative to said input audio signal, but are inverted when combined with said input audio signal to ensure that said dynamically compressed bass frequency components and input audio signal are combined in an out-of-phase relationship.

4. The audio signal processing device as defined in claim 1 wherein said dynamically compressed bass frequency components produced by said close-loop bass compressor are inverted relative to said input audio signal, but are not inverted when combined with said input audio signal to ensure that said dynamically compressed bass frequency components and input audio signal are combined in an out-of-phase relationship.

5. An audio signal processing device for enhancing bass frequency components of an input audio signal without substantially increasing the peak level of the input audio signal, comprising:
   a. a splitter for dividing said input audio signal into a first part and a second part;
   b. a low pass filter for filtering said second part of said input audio signal and outputting bass frequency components of said second part of said input audio signal;
   c. a variable gain amplifier coupled to said low pass filter for processing said bass frequency components output from said low pass filter and producing compressed bass frequency components;
   d. a signal level detector coupled to said variable gain amplifier for detecting said bass frequency components and providing a responsive gain control signal to said variable gain amplifier, such that said variable gain amplifier provides greater gain of said bass frequency components when said bass frequency components are at a lower level but lesser gain of said bass frequency components when said bass frequency components are at a higher level; and
   e. a combiner for combining said first part of said input audio signal and said compressed bass frequency components, said first part of said input audio signal and said compressed bass frequency components being combined in an out-of-phase relationship such that said bass frequency components in said input audio signals can be enhanced without overloading any subsequent audio amplifiers.

6. The audio signal processing device as defined in claim 5 wherein said compressed bass frequency components produced by said variable gain amplifier are not inverted relative to said input audio signal, but are inverted when combined by said combiner with said input audio signal to ensure that said enhanced bass frequency components do not overload any subsequent audio amplifiers.

7. The audio signal processing device as defined in claim 5 wherein said compressed bass frequency components produced by said variable gain amplifier are inverted relative to said input audio signal, but are not inverted when combined by said combiner with said input audio signal to ensure that said enhanced bass frequency components do not overload any subsequent audio amplifiers.

* * * * *